United States Patent Office 3,432,405

Patented Mar. 11, 1969

3,432,405

SELECTIVE MASKING METHOD OF SILICON DURING ANODIZATION

David J. Pilling, Los Altos, and Maurice E. Dumesnil, Palo Alto, Calif., assignors to Fairchild Camera and Instrument Corporation, Syosset, N.Y., a corporation of Delaware No Drawing. Filed May 16, 1966, Ser. No. 550,140
U.S. Cl. 204—15 7 Claims
Int. Cl. C23b 5/48

This invention concerns a novel method for the fabrication of semiconductor devices by selectively masking silicon wafers during anodic oxidation. More particularly, the invention concerns a novel method for fabricating semiconductor devices by selectively masking silicon wafers with a dielectric mask prior to anodic oxidation.

Anodic oxidation of silicon wafers in semiconductor device fabrication has many advantages. Anodic oxidation permits careful control of the oxide thickness: empirically, the thickness of the oxide can be related to the voltage change during the anodic oxidation. By careful monitoring of the voltage, predetermined silicon oxide thicknesses can be reproducibly achieved. A further advantage, particularly with capacitors, is the higher dielectric constant of anodic silicon oxide as compared to thermal silicon oxide. The higher dielectric constant of the anodic oxide permits capacitors of higher capacitance to be fabricated. A third advantage of anodic oxidation is the low temperature at which the oxidation is carried out. For with thermal oxide, the high temperatures required for the oxidation frequently cause numerous imperfections at the silicon-silicon dioxide interface, as well as migration of the dopant. The imperfections can act as recombination centers, which result in soft junctions and high reverse leakage. The low temperature of anodic oxidation minimizes the introduction of dislocations and surface imperfections.

Unfortunately, much of the technology which has been learned with thermal oxidation cannot be utilized with anodic oxidation. This is particularly true with selective oxidation of the silicon wafer surface. The polymeric masks, commonly known as photoresists, used for masking thermally grown oxide do not maintain the high adherence to silicon necessary in silicon anodization. When the silicon wafer has been metallized, prior to the anodic oxidation, the metal must be properly isolated or the anodizing current will be shunted to the metal contact. Stop-off compounds such as paraffin or ceresin waxes do not form good seals. Epoxy resins form excellent seals, but are attacked by some anodizing solutions. Moreover, applying and removing stop-offs is usually time consuming.

Pursuant to this invention, a method is provided during the fabrication of semiconductor devices for selectively masking silicon wafers for anodic oxidation. The method comprises coating the silicon wafer surface with a continuous metal oxide-silicate film, selectively removing the silicate film from the areas on the silicon wafer surface to be anodically oxidized, and anodically oxidizing the unprotected areas of the silicon surface. By using various silicates, both crystalline and noncrystalline, silicon wafers can be selectively masked, anodically oxidized, and the masking substance removed without damage to the anodic oxide after anodization.

A variety of metal oxide-silicate compositions may be used in the process of this invention. The metal silicates may be non-crystalline (glass) or crystalline; they may be synthetic or naturally occurring. Usually, silica ($SiO_2$) will be present in amounts of from about 10–70 weight percent, the remainder of the composition being primarily at least one oxide and usually two oxides of the metals aluminum, lead, boron, and titanium. Usually, lead and/or aluminum oxides will be present, their total amount being from about 25 to 80 weight percent of the composition. Small amounts of other metal oxides may be present, such as the oxides of calcium, magnesium, barium, phosphorus, and a very low level of sodium and potassium oxides.

When the metal oxide-silicates are used as masks, they may be subsequently removed or may be retained as part of the semiconductor device structure. If the silicate used for masking is to be later removed, a glass silicate is ordinarily used as the selective mask. By glass is meant a noncrystalline substance comprised of silica, and also containing other metal oxides, e.g., lead and aluminum. Preferred glasses also have a total of from about 10 to 20 weight percent of boron and titanium oxides. The preferred silicate glasses are those having a thermal expansion which approximates that of silicon, e.g., 30 to $65\times10^{-7}$ cm./cm./° C., although glasses with higher expansions are used with thinner masks, e.g., less than about 2 microns. The glasses may have softening points at temperatures in the range of from about 350–1000° C. It is usually easier to use a low melting glass, i.e., a glass having a softening point below about 750° C. The glasses having softening points above about 750° C. cannot be used when the wafer has been metallized. For, in creating a smooth coat of the glass, the high temperature will result in the metal, particularly aluminum, combining with the silicon surface. Also, at the higher temperatures, some dopant migration in the underlying silicon may occur, plus dislocations may form at the silicon surface. Therefore, by using a glass having a softening point at a temperature below about 750° C., preferably below about 560° C., the glass can be used with metallized semiconductors and detrimental effects minimized.

The glasses having the low softening points, that is below about 750° C., have for the most part lead oxide in addition to the silica and other oxides normally present in the glass. The amount of lead oxide will generally be in the range from about 50 to 80 weight percent of the composition. These low melting glasses are frequently referred to as solder glasses.

The glass can be conveniently deposited onto the silicon wafer in the following manner. The silicon wafer is placed in a holder in a horizontal position at the bottom of a centrifuge tube. The wafer is then covered with a layer of a high density organic compound, usually a halohydrocarbon to the extent of 1 or 2 centimeters. Over this layer is placed a layer of 1 or more centimeters of a dispersion of fine glass powder in a lower alkanol dispersant, for example isopropanol. The powder will usually be less than about 5 microns average particle life, more usually about 0.5 to 2 microns. The powder will ordinarily be from about 0.5 to 5 weight percent of the dispersion. The tube containing the wafer and the two layers above the wafer is then placed in a centrifuge, spun at about 2000 G's, thus depositing the powder in the form of a firmly packed, continuous film on the wafer. The glass is heated to slightly above its softening point forming a pinhole-free smooth glass film.

When the mask is to become a permanent part of the semiconductor structure, generally a naturally occurring aluminum silicate will be used (aluminum oxide-silicon oxide composition). Illustrative materials include mullite, sillimanite, kyanite, and andalusite. These materials are either stable at the temperatures of evaporation or produce a compound stable at those temperatures. These materials are deposited onto the silicon wafers by placing the wafers in a vacuum jar, evacuating the vacuum jar and evaporating the aluminum silicate by electron beam evaporation. The pressure in the vacuum jar will be from about $4\times10^{-6}$ to $3\times10^{-5}$ torr. The aluminum silicates generally have softening points above about 1000° C.

The metal silicate coating on the wafer surface will generally be of a thickness of from about 1.5 to 20 microns, more usually from about 2 to 15 microns. A minimum thickness is necessary to provide mechanical protection for the wafer surface. On the other hand, too large a thickness is undesirable because it is time consuming, both in its formation and in its removal. Also, too large a thickness may interfere with subsequent steps in the fabrication of the semiconductor device.

The techniques used with silicon dioxide for selectively removing the silicon dioxide when used as a mask can for the most part—except when using a selective etchant—be also applied to the present masks. That is, normal photoresist techniques can be used for selectively removing the silicate mask. Any of the conventional photoresist materials may be used for pattern definition. The etchant varies with the metal-oxide silicate deposited. The glasses may be conveniently removed with various etchants, dilute nitric acid, e.g., 0.1 N, being convenient. The crystalline aluminum silicates, e.g., mullite, may be removed with a chromic acid etch prepared by saturating phosphoric acid with chromic oxide. After the mask has been etched to provide the necessary pattern definition, the wafer may then be anodically oxidized.

Any convenient method for anodic oxidation may be used. The wafer may be connected at the anode and immersed in a solution of an electrolyte. The convenient holder for the wafer is utilized. This can include a clip or other means. However, a particularly preferred holder is described in copending application 550,531, filed on May 16, 1966. This holder provides a resilient support to which the wafer is held by applying pressure differential to both sides of the wafer. An electrical conductor through the resilient support contacting the wafer provides the necessary electrical connection from the wafer to the positive terminal of a power source. Any conventional cathode may be used, such as a cathode made of platinum, steel, etc. The oxidation process is carried out at about room temperature (20° to 35° C.).

In the anodic oxidation, an organic solvent is used. Illustrative solvents include dimethyl formamide, ethylene glycol, etc. Usually, a small amount of an oxygen-containing inorganic salt and traces of water are included in the electrolyte. The currents used range from about 4 to 20 milliamps per square centimeter. The necessary current and voltage depend on the size of the wafers, their number, and the oxide thickness. Ordinarily, not more than about 600 volts will be required.

The thickness of the oxide can be measured by monitoring the increase in voltage as the oxidation proceeds. An empirical relationship can be determined between oxide thickness and forming voltage. When the desired thickness of the oxide has been achieved, the current is shut off and the wafer removed from the electrolyte solution, washed with deionized water, and dried.

Once the anodic oxide has been formed, the metal oxide-silicate mask may be removed either totally or in part or may be retained as part of the semiconductor device structure. For selective removal of the mask, the steps previously described for selective removal need only be repeated. If the mask is to be completely removed, the wafer is dipped or immersed in the proper etchant for sufficient time to remove the mask, without significant diminution of the anodic oxide.

In order to demonstrate the method of this invention, the method will be described as used in the fabrication of a mesa transistor. The illustrated example of the inventive process effects the passivation of an exposed PN junction with anodic oxide and at the same time leaves the top of the mesa exposed for electrical contact to the diode. An alternative method, that of anodizing the whole mesa structure and selectively masking the sides of the mesa in order to etch the top of the mesa is not feasible with present photoresist technology.

A silicon wafer having a mesa structure is coated with glass powder as follows. Solder glass (high lead oxide content) is broken into a fine powder of less than 5 microns in particle size and dispersed in isopropanol. The wafer is held in a holder in a centrifuge tube and covered with a few (e.g., 1–2) centimeters of tetrachloroethylene. The dispersion of glass in isopropanol is then poured onto the tetrachloroethylene layer to form a second layer of the isopropanol dispersion of about 5 centimeters high, after which the tube plus contents is centrifuged at about 2000 G's. The powdered glass forms a fine but discontinuous coating on the wafer. The glass has a softening point of about 460° C. and, in order to make the glass film continuous, the wafer is heated in a tube at slightly above this temperature. By maintaining the wafer at this temperature for about 10 minutes, the particles fuse and run together such that a smooth pinhole-free, glossy dielectric film is formed. The glass is then masked by usual photoresist techniques and selectively etched with about 0.1 N nitric acid to exposed the areas to be anodized, i.e., the PN junction. Thus, the surface above the mesa structure is now coated with glass, while the PN junction is exposed for anodic oxidation.

The silicon wafer is then oxidized by anodic oxidation in a 0.04 N potassium nitrate ethylene glycol solution having a trace of water present (0.1–1.0 volume percent). A constant current in the range of 4–5 milliamps per square centimeter is maintained. The maximum forming voltage is 140 volts. By means of this anodic oxidation, 800 angstroms of anodic oxide is grown on the sides of the mesa, producing hard reverse bias breakdown voltages of 80 volts.

The second illustration of the process of this invention concerns a silicon wafer having two isolated areas of thermal oxide which have a continuous aluminum strip bonded to the oxide surface, the strip making contact with the silicon surface between the islands of thermal oxide. The wafer is placed in a holder which leaves the portion to be coated exposed. The wafer is then placed in a vacuum jar and the jar evacuated. Mullite is deposited onto the wafer in a vacuum bell jar in vacuo by electron beam evaportion of the mullite. The pressure in the bell jar is about $3\times10^{-5}$ torr. The wafer is coated with about 1000 to 5000 angstroms thick of mullite. The wafer is now selectively etched by using ordinary photoresist techniques and a hydrofluoric acid etchant. The time required for removing the mullite is about 5 to 10 minutes. The surface of the silicon which is to be anodically oxidized is thus exposed.

The wafer is then anodically oxidized at a constant current in the range of about 4–5 milliamps per square centimeter using ultrasonic agitation to prevent hydrogen bubbles from causing imperfections in the anodic oxide. The maximum forming voltage was 390 volts. By this means, 2,200 angstroms of anodic oxide was grown on silicon wafers without deterioration of the masking film.

It is evident that the process of this invention adds great flexibility to the fabrication of semiconductor devices. The many advantages of anodic oxidation have already been discussed. However, anodic oxidation has not found general use because of its many limitations. A major limitation which the present process eliminates is the lack of an effective mask. The present process provides an effective mask which permits a new and improved method of fabrication of semiconductor devices; improvement in the passivation of PN junctions; and, fabrication of superior capacitors. Moreover, the silicon dioxide wafers which have been metallized can now be anodically oxidized without current being shunted to the metal.

As will be apparent to those skilled in the art, many modifications may be made in the details of the invention without departing from its spirit and scope. Accordingly, the only limitations to be placed on the scope of this invention are those specifically stated in the claims which follow.

What is claimed is:

1. A method for selectively anodically oxidizing silicon wafers in the fabrication of semiconductor devices which comprises:

coating the silicon surface with a continuous metal oxide-silicate film, selectively removing the metal oxide-silicate film from the areas on the silicon wafer surface to be anodically oxidized, and anodically oxidizing the unprotected areas.

2. A method according to claim 1, wherein the metal oxide-silicate contains at least 10% by weight of at least one of aluminum oxide or lead oxide.

3. A method according to claim 1, wherein said metal oxide-silicate is a glass containing substantial amounts of at least one of aluminum oxide or lead oxide and lesser amounts of at least one of boric oxide or titanium oxide.

4. A method according to claim 1, wherein the continuous metal oxide-silicate film is formed by evenly depositing a glass powder of a particle size of less than about 5 microns onto the silicon wafer surface, wherein said glass has a softening point of less than 750° C., and then heating the wafer to a temperature to about the glass softening point to provide a continuous glass film.

5. A method according to claim 1, wherein said metal oxide-silicate is an aluminum silicate.

6. A method according to claim 1, wherein said continuous metal oxide-silicate film is formed by electron beam evaporation of a crystalline aluminum silicate in vacuo in the presence of said silicon wafer.

7. A method of passivating PN junctions with anodic oxide which comprises, coating the silicon wafer surface with a film of lead silicate having a softening point below 750° C. and an expansion coefficient in the range of $30–65 \times 10^{-7}$ cm./cm./° C., removing by photoresist techniques a portion of the film over the PN junction to be passivated and anodically oxidizing the exposed silicon at the PN junction, forming an anodic silicon dioxide layer over the PN junction, thus passivating the PN junction.

References Cited

UNITED STATES PATENTS

| | | | |
|---|---|---|---|
| 3,220,938 | 11/1965 | McLean et al. | 204—15 |
| 3,237,271 | 3/1966 | Arnold et al. | 204—32 |
| 3,345,274 | 10/1967 | Schmidt | 204—15 |

HOWARD S. WILLIAMS, *Primary Examiner.*

T. TUFARIELLO, *Assistant Examiner.*

U.S. Cl. X.R.

204—32